(12) United States Patent
Kurauchi

(10) Patent No.: US 7,719,181 B2
(45) Date of Patent: May 18, 2010

(54) ORGANIC EL DEVICE, METHOD FOR PRODUCING ORGANIC EL DEVICE, AND ELECTRONIC APPARATUS

(75) Inventor: Nobuyuki Kurauchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 326 days.

(21) Appl. No.: 11/956,013

(22) Filed: Dec. 13, 2007

(65) Prior Publication Data
US 2008/0185959 A1  Aug. 7, 2008

(30) Foreign Application Priority Data
Feb. 6, 2007  (JP) ............................. 2007-026451

(51) Int. Cl.
   *H01J 1/62*  (2006.01)
(52) U.S. Cl. ..................................... 313/505
(58) Field of Classification Search ......... 313/498–512; 315/169.3, 169.4; 445/24
   See application file for complete search history.

(56) References Cited

U.S. PATENT DOCUMENTS

| | | | | |
|---|---|---|---|---|
| 6,538,374 B2 * | 3/2003 | Hosokawa | ................... | 313/504 |
| 7,432,885 B2 * | 10/2008 | Asano et al. | ............. | 315/169.3 |
| 7,492,096 B2 * | 2/2009 | Koo et al. | .................... | 313/506 |
| 7,495,389 B2 * | 2/2009 | Noguchi et al. | ............. | 313/506 |
| 2006/0017375 A1 * | 1/2006 | Noguchi et al. | ............. | 313/504 |
| 2007/0071885 A1 * | 3/2007 | Kumagai | .................... | 313/506 |
| 2009/0256470 A1 * | 10/2009 | Naono | ........................ | 313/504 |

FOREIGN PATENT DOCUMENTS

| | | |
|---|---|---|
| JP | A-11-008073 | 1/1999 |
| JP | A-2001-195008 | 7/2001 |
| JP | A-2003-288994 | 10/2003 |
| JP | A-2004-207217 | 7/2004 |
| JP | A-2005-235491 | 9/2005 |

* cited by examiner

*Primary Examiner*—Peter Macchiarolo
(74) *Attorney, Agent, or Firm*—Oliff & Berridge, PLC

(57) ABSTRACT

An organic EL device includes a substrate; first electrodes corresponding to individual pixels on the substrate; partitions partitioning the first electrodes to define substantially rectangular pixel regions; organic functional layers, corresponding to the individual pixels, disposed at least in the pixel regions; a second electrode disposed on the organic functional layers and the partitions; and auxiliary lines disposed on a top or bottom surface of the second electrode to support the conductivity of the second electrode. The auxiliary lines extend through the pixel regions so as to cross longer sides thereof and divide the pixel regions into a plurality of subregions.

6 Claims, 7 Drawing Sheets

ORGANIC EL DEVICE, METHOD FOR PRODUCING ORGANIC EL DEVICE, AND ELECTRONIC APPARATUS

BACKGROUND

1. Technical Field

The present invention relates to organic electroluminescent (EL) devices, methods for producing organic EL devices, and electronic apparatuses.

2. Related Art

Organic EL devices are self-luminous devices requiring no light source such as a backlight. An organic EL device includes light-emitting elements arranged on a substrate, each including a light-emitting layer formed of an organic EL material and held between a pair of electrodes. According to the direction in which light emitted from the light-emitting layer is output, organic EL devices can be classified into a bottom-emission structure, in which light is output through a substrate, or a top-emission structure, in which light is output through the opposite side.

In an organic EL device having the top-emission structure, the individual pixels are defined by partitions which partition pixel electrodes (first electrodes) to form substantially rectangular apertures. Of the pair of electrodes holding the light-emitting a layer, a common electrode (second electrode) is disposed on the side where light exits. The common electrode is formed of a transparent conductive material such as indium tin oxide (ITO) or indium zinc oxide (IZO).

An ITO or IZO film causes a voltage gradient inside the common electrode because the film has higher resistance than a metal film. This voltage imbalance inside the common electrode degrades the image quality of the organic EL device.

To avoid the voltage imbalance inside the common electrode, auxiliary lines having low resistance are disposed in contact with the common electrode on the partitions forming the individual pixels (for example see JP-A-2001-195008, JP-A-2003-288994, JP A-2004-207217, and JP-A-2005-235491). The auxiliary lines thus prevent the degradation of image quality of the organic EL device.

The organic EL device described above, however, has the following problem.

The organic EL device has an insufficient aperture rate per pixel because the auxiliary lines are formed on the partitions forming the pixel regions. The partitions must be formed so as to leave the regions required to form the apertures, the regions where the auxiliary lines are formed, and the regions required to provide a manufacturing margin for the auxiliary lines. This problem is more serious for organic EL devices having finer pixels.

Hence, the organic EL device requires more current to provide sufficient light intensity. This imposes a high load on, for example, the light-emitting layer, thus decreasing the life of the organic EL device.

SUMMARY

An advantage of some aspects of the invention is that they provide an organic EL device, including organic functional layers corresponding to individual pixels on a substrate, with an increased aperture rate per pixel and an extended life, and also provide a method for producing the organic EL device.

An organic EL device according to a first aspect of the invention includes a substrate; first electrodes corresponding to individual pixels on the substrate; partitions partitioning the first electrodes to define substantially rectangular pixel regions; organic functional layers, corresponding to the individual pixels, disposed at least in the pixel regions; a second electrode disposed on the organic functional layers and the partitions; and auxiliary lines disposed on a top or bottom surface of the second electrode to support the conductivity of the second electrode. The auxiliary lines extend through the pixel regions so as to cross longer sides thereof and divide the pixel regions into a plurality of subregions. The above structure, in which the auxiliary lines are disposed in the pixel regions, can eliminate the need to leave the regions where the auxiliary lines are formed on the partitions and the regions for providing a manufacturing margin for the auxiliary lines, so that the width of the partitions can be reduced. This increases the area of each aperture and thus the aperture rate per pixel. The organic EL device can therefore provide sufficient light intensity with lower current, thus achieving an extended life.

A method according to a second aspect of the invention for producing an organic EL device including organic functional layers corresponding to individual pixels on a substrate includes forming first electrodes corresponding to the individual pixels; forming partitions partitioning the first electrodes to define substantially rectangular pixel regions; forming the organic functional layers at least in the pixel regions; forming a second electrode on the organic functional layers and the partitions; and forming auxiliary lines on a top or bottom surface of the second electrode such that the auxiliary lines extend through the pixel regions so as to cross longer sides thereof and divide the pixel regions into a plurality of subregions. This method contributes to an increased product yield and reduced manufacturing costs because the auxiliary lines are formed with a sufficient manufacturing margin as compared with the case where the auxiliary lines are formed on the partitions.

In the method for producing the organic EL device, the auxiliary lines may be formed by mask deposition. The use of mask deposition eliminates the need to use a production method including many steps such as photolithography, thus reducing the manufacturing costs. In addition, a mask can be used to accurately form the auxiliary lines.

In the method for producing the organic EL device, the organic functional layers may be formed by vapor deposition. The use of vapor deposition eliminates the need to form partitions under the partitions using an inorganic compound, thus shortening the production process and reducing the manufacturing costs.

In the method for producing the organic EL device, the second electrode may be formed by vapor deposition. The use of vapor deposition to form the second electrode prevents permeation of the source material of the second electrode into the organic functional layers or the partitions. Using vapor deposition, additionally, the organic functional layers, the second electrode, and the auxiliary lines can be simultaneously formed in the same deposition apparatus, thus shortening the production process and reducing the manufacturing costs.

It is preferable that an electronic apparatus includes the organic EL device described above. This electronic apparatus is highly reliable and has superior light-emission characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
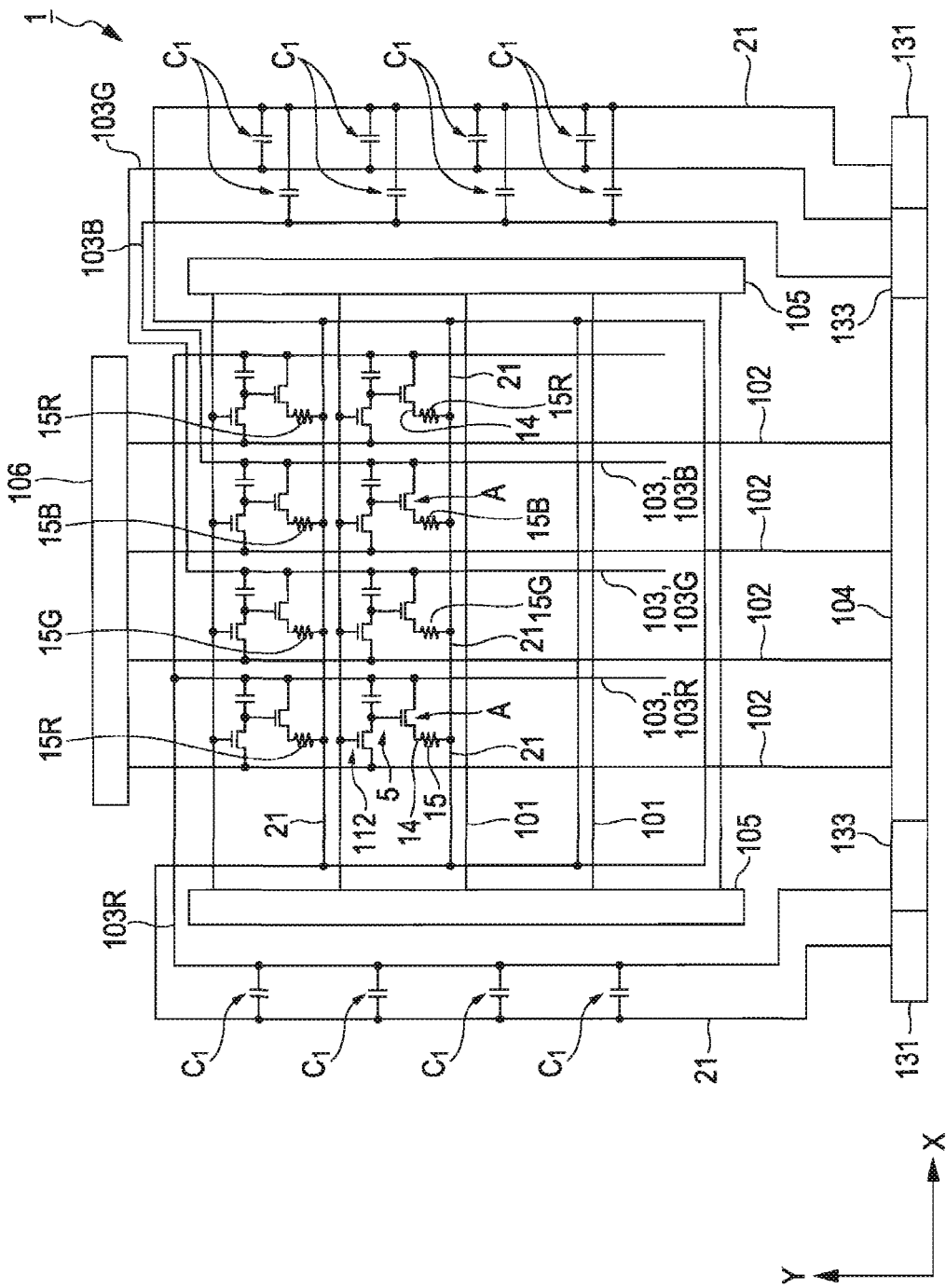
FIG. 1 is an equivalent circuit diagram of an organic EL device according to an embodiment of the invention.

The structure of an organic EL device 1 according to an embodiment of the invention and a method for producing the organic EL device 1 will now be described with reference to the drawings. The organic EL device 1 according to this embodiment has a top-emission structure and includes a light-emitting layer formed of an organic EL material that emits white light and a color filter disposed on a counter substrate to provide a full-color display. This embodiment is merely an example of the invention and should not be construed as limiting the invention, which can be optionally modified within the scope of the technical idea of the invention. For illustrative purposes, the individual structures shown in the drawings differ from actual structures in, for example, scale and number of components.

To illustrate the positional relationship between the individual components, an XYZ orthogonal coordinate system will be used in the description below, where a predetermined direction in a plane is defined as the X-axis direction, a direction orthogonal to the X-axis direction in the plane is the Y-axis direction, and a direction orthogonal to the X-axis and, Y-axis directions is defined as the Z-axis direction.

Structure of Organic EL Device

FIG. 1 is an equivalent circuit diagram of the organic EL device 1 according to this embodiment. The organic EL device 1 includes scanning lines 101 extending in the X-axis direction, signal lines 102 extending in a direction crossing the scanning lines 101 (in the Y-axis direction), and light-emission power lines 103 extending parallel to the signal lines 102. Pixel regions A are disposed near the intersections of the scanning lines 101 and the signal lines 102.

The signal lines 102 are electrically connected to a data drive circuit 104 including a shift register, a level shifter, a video line, and an analog switch. The signal lines 102 are also electrically connected to an inspection circuit 106 including a thin-film transistor (TFT). The scanning lines 101 are electrically connected to scanning drive circuits 105 including shift registers and level shifters.

Each pixel region A includes a pixel circuit including a switching TFT 112, a hold capacitor C, a drive TFT 5, a pixel electrode (first electrode) 14, an organic functional layer 15, and a common electrode (second electrode) 21. The switching TFT 112 has a gate electrode electrically connected to one of the scanning lines 101. The switching TFT 112 is switched on and off in response to a scanning signal supplied from the scanning line 101. An image signal is supplied from the signal line 102 through the switching TFT 112 and is held by the hold capacitor C.

The drive TFT 5 has a gate electrode electrically connected to the switching TFT 112 and the hold capacitor C so that the image signal is supplied from the hold capacitor C to the gate electrode. The pixel electrode 14 is electrically connected to the drive TFT 5 and is supplied with a drive current from one of the light-emission power lines 103 through the drive TFT 5. The organic functional layer 15 includes three sublayers including a white light-emitting layer and is held between the pixel electrode 14 and the common electrode 21. Each organic EL element, serving as a light-emitting element, includes the pixel electrode 14, the organic functional layer 15, and the common electrode 21.

The organic functional layers 15 include red-pixel organic functional layers 15R that emit red light through the color filter, green-pixel organic functional layers 15G that emit green light through the color filter, and blue-pixel organic functional layers 15B that emit blue light through the color filter. The organic functional layers 15R, 15G, and 15B are formed substantially in a stripe pattern extending in the Y-axis direction and are regularly arranged in the X-axis direction in the above order. The organic functional layers 15R, 15G, and 15B are electrically connected to the respective light-emission power lines 103R, 103G, and 103B through the drive TFTs 5. The light-emission power lines 103R, 103G, and 103B in turn are electrically connected to light-emission power circuits 133.

First capacitors C1 are disposed between the common electrode 21 and the light-emission power lines 103R, 103G, and 103B to accumulate electrical charges. If the potential of the drive current; flowing through the individual light-emission power lines 103 varies during the driving of the organic EL device 1, the first; capacitors C1 discharge the accumulated electrical charges into the light-emission power lines 103 to suppress variations in the potential of the drive current.

In the organic EL device 1 having the above structure, when scanning signals are supplied through the scanning lines 101 to switch on the switching TETs 112, the potentials of the signal lines 102 at that time are held by the hold capacitors C. The drive TFTs 5 are switched on and off in response to the potentials held by the hold capacitors C. The drive current flows from the light-emission power lines 103R, 103G, and 103B to the pixel electrodes 14 through the channels of the drive TFTs 5. The current then flows to the common electrode 21 through the organic functional layers 15R, 15G, and 15B, which emit light having an intensity corresponding to the amount of current flowing through the organic functional layers 15R, 15G, and 15B.

Figure 2:
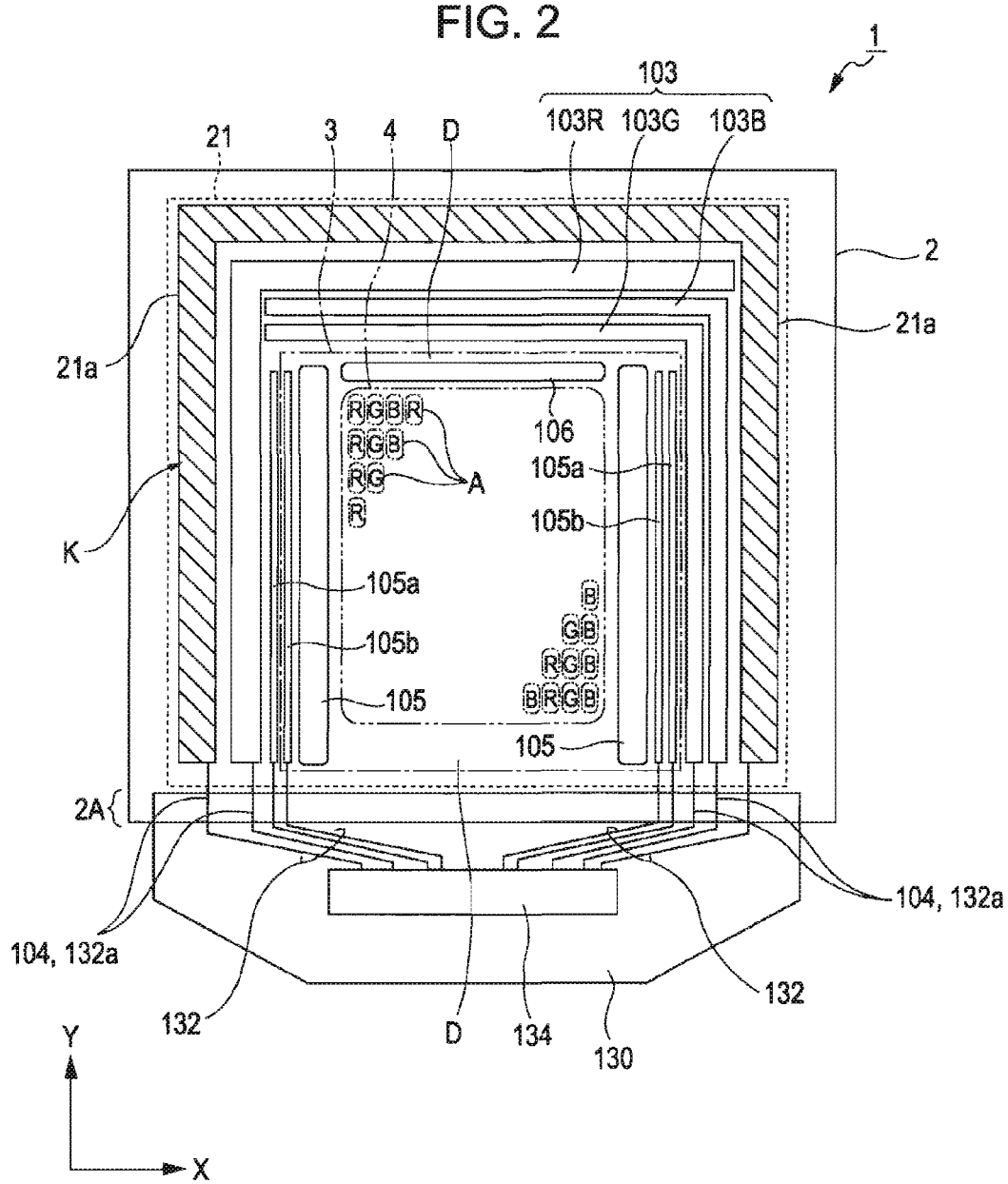
FIG. 2 is a plan view of the organic EL device.

FIG. 2 is a plan view of the organic EL device 1. The planar structure of the organic EL device 1 will now be described with reference to FIG. 2. The organic EL device 1 according to this embodiment, which has a top-emission structure, includes a transparent or nontransparent substrate 2. The light-emission power lines 103 (103R, 103G, and 103B, and a display pixel portion 3 (enclosed by the one-dot chain line in FIG. 2) are disposed in the center of the substrate 2. An effective display region 4 (enclosed by the two-dot chain line in FIG. 2) having a substantially rectangular shape in plan view and including the pixel regions A is disposed in the center of the display pixel portion 3. The scanning drive circuits 105 and the inspection circuit 106 are disposed around the periphery of the effective display region 4. A terminal portion 2A including terminals 104 are disposed on one side of the substrate 2 parallel to the X-axis. The scanning drive circuits 105 are disposed along the two sides adjacent to the terminal portion 2A side, and the inspection circuit 106 is disposed along the other side. Control signal lines 105a and power lines 105b for the scanning drive circuits 105 are disposed outside the scanning drive circuits 105 and are electrically connected thereto.

The display pixel portion 3 includes the effective display region 4, disposed in the center thereof, and a dummy region D (region between the one-dot and two-dot chain lines) disposed around the effective display region 4. The pixel regions A are arranged in a matrix in the effective display region 4. The scanning drive circuits 105, the inspection circuit 106, and the control signal lines 105a and power lines 105b for the scanning drive circuits 105 are disposed in the dummy region D around the effective display region 4. The light-emission power lines 103 (103R, 103G, and 103B) are disposed around the dummy region D (i.e., around the display pixel portion 3).

The light-emission power lines 103 are L-shaped in plan view along the outside of the control signal lines 105a for the scanning drive circuits 105 and the inspection circuit 106. The light-emission power line 103R connected to the red pixels (R) extends in the Y-axis direction along the control signal line 105a on the left of FIG. 2, is bent to the right at the end of the control signal line 105a, and extends in the X-axis direction along the outside of the inspection circuit 106. The light-emission power line 103G connected to the green pixels (G) and the light-emission power line 103B connected to the blue pixels (B) extend in the Y-axis direction along the control signal line 105a on the right of FIG. 2, are bent to the left at the end of the control signal line 105a, and extend in the X-axis direction along the outside of the inspection circuit 106. The light-emission power lines 103R, 103G, and 103B are disposed around three sides of the display pixel portion 3 and are electrically connected to the pixels A via wiring (not shown).

A common-electrode line 21a is disposed outside the light-emission power lines 103R, 103G, and 103B. The common-electrode line 21a is box-shaped in plan view along the three sides of the substrate 2 other than the side where a flexible wiring board 133 is disposed, surrounding the outside of the light-emission power lines 103R, 103G, and 103B. The common electrode 21 is disposed over substantially the entire region of the substrate 2, including the effective display region 4 and the region where the common-electrode line 21a is disposed. The common electrode 21 is electrically connected to the common-electrode line 21a in a region where they overlap each other.

The wiring board 130 is electrically connected to the terminal portion 2A of the substrate 2. The wiring board 130 includes a flexible plastic base having terminals 132a arranged on the side of the base adjacent to the substrate 2. The terminals 132a are connected to wiring lines 132 on which a control IC 134 is mounted. The control IC 134 includes the data drive circuit 104, common-electrode power circuits 131, and the light-emission power circuits 133, as shown in FIG. 1.

Figure 3:
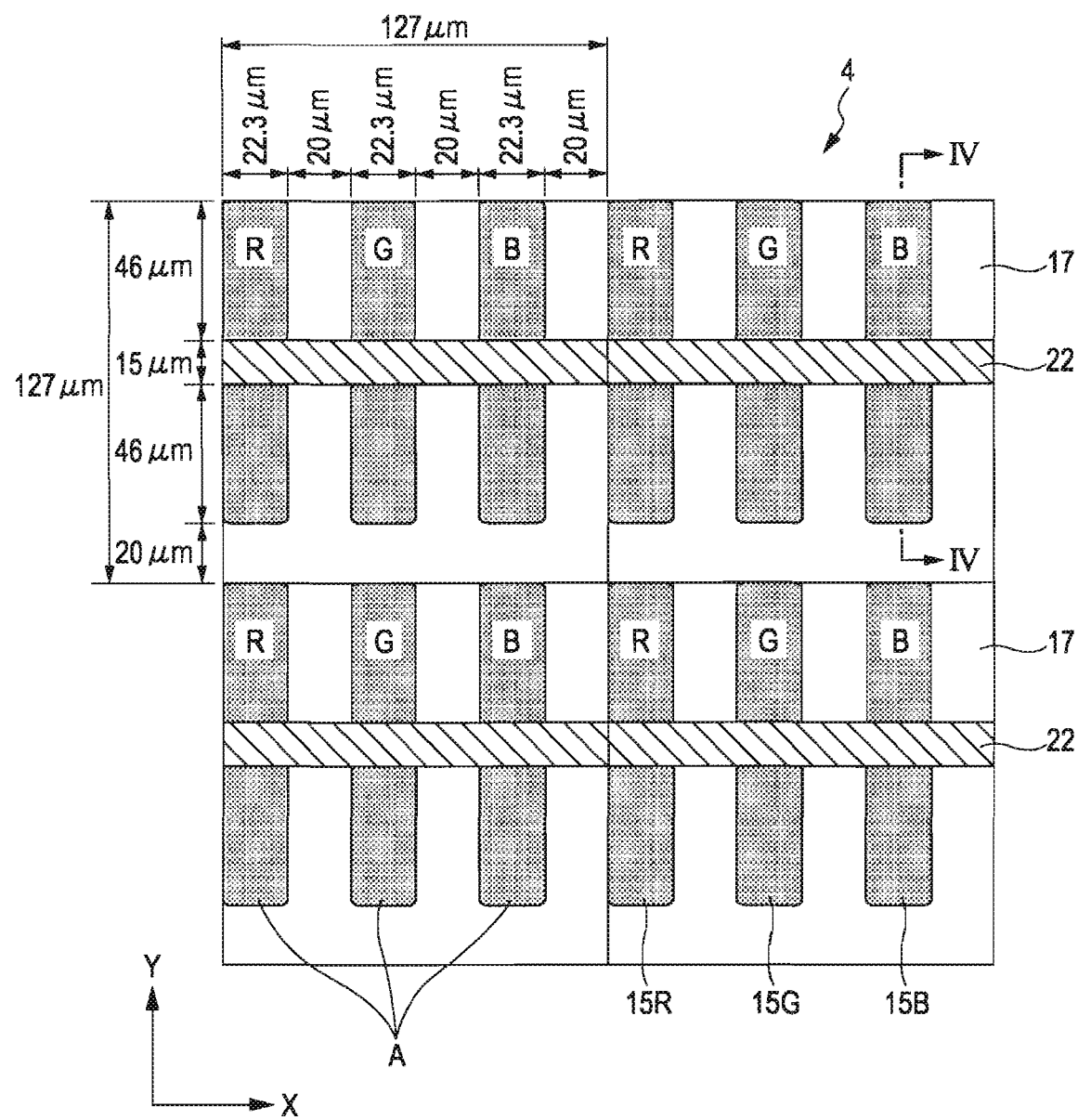
FIG. 3 is an enlarged view of an effective display region of the organic EL device.

FIG. 3 is an enlarged view of the effective display region 4 of the organic EL device 1. In FIG. 3, the organic functional layers 15R, 15G, and 15B, which form the pixel regions A, are formed in substantially rectangular openings defined by the partitions 17 on the pixel electrodes 14 (not shown). The pixel regions A are arranged in lines in the lateral direction thereof. Auxiliary lines 22 are formed so as to extend in the X-axis direction through the centers of the pixel regions A in the longitudinal direction thereof (in the Y-axis direction) and the partitions 17 adjacent to longer sides of the pixel regions A. That is, the auxiliary lines 22 are formed so as to divide the pixel regions A into a plurality of subregions.

Figure 4:
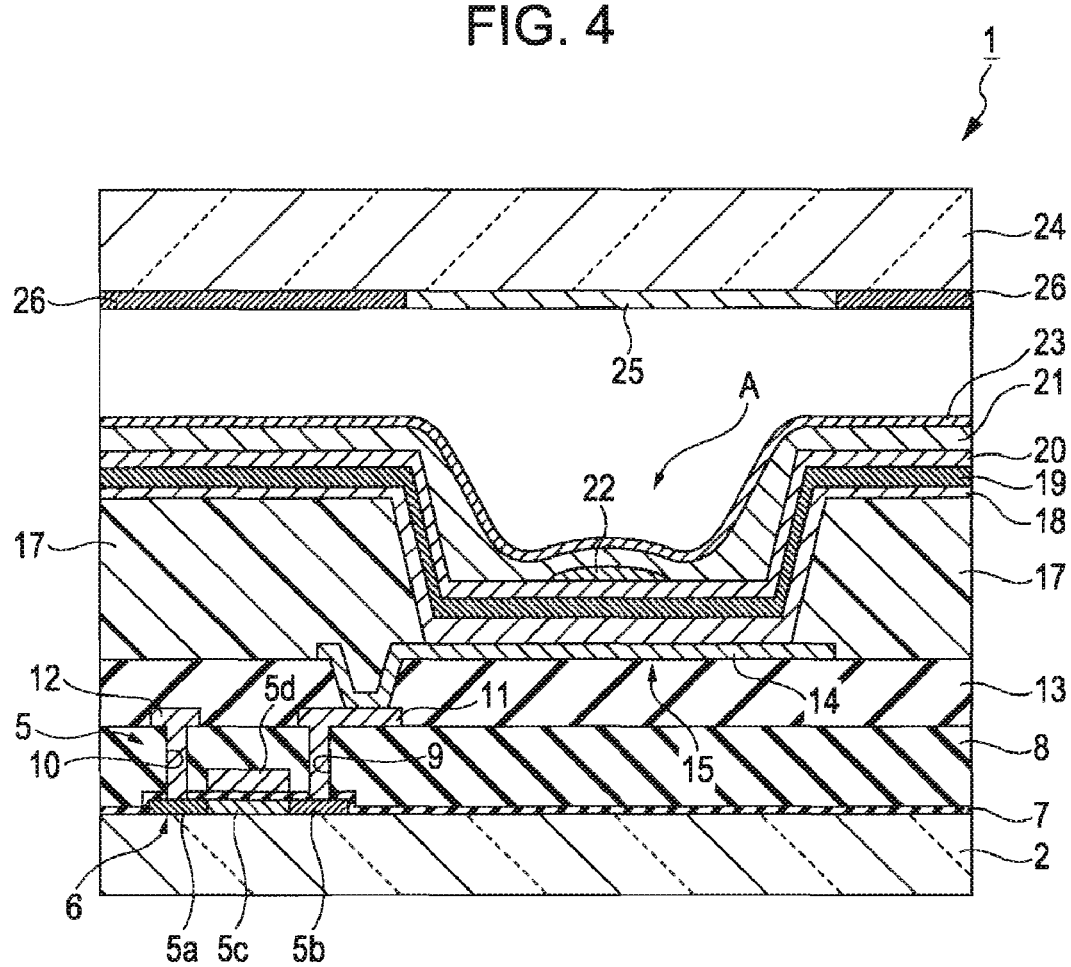
FIG. 4 is a sectional view, taken along line IV-IV of FIG. 3, of the organic EL device.

FIG. 4 is a sectional view, taken along line IV-IV of FIG. 3, of the organic EL device 1. The structure of the organic EL device 1 will now be described with reference to FIG. 4. Because the organic EL device 1 has a top-emission structure and outputs light through the second electrode 21, the substrate 2 used can be either a transparent substrate, such as a glass substrate, or a nontransparent substrate. Examples of nontransparent substrates include ceramic substrates such as alumina substrates; metal sheets, including stainless steel sheets, subjected to insulation treatment such as surface oxidation; and thermosetting and thermoplastic resin substrates.

The drive TFT 5 is formed on the substrate 2. The drive TFT 5 includes a source region 5a, a drain region 5b, and a channel region 5c formed in a semiconductor film 6 and a gate electrode 5d disposed opposite the channel region 5c with a gate insulating film 7, formed on the semiconductor film 6, disposed therebetween. A first interlayer insulating film 8 is formed over the semiconductor film 6 and the gate insulating film 7. A drain electrode 11 and a source electrode 12 are disposed on a surface of the first interlayer insulating film 8 and in contact holes 9 and 10, respectively, reaching the semiconductor film 6 through the first interlayer insulating film 8. The drain electrode 11 and the source electrode 12 are electrically connected to the drain region 5b and the source region 5a, respectively. A second interlayer insulating film 13 is formed and planarized on the first interlayer insulating film 8.

The pixel electrode 14, used as the anode of the organic EL element, is formed on the second interlayer insulating film 13. Part of the pixel electrode 14 is embedded in a contact hole penetrating the second interlayer insulating film 13 and is electrically connected to the drain electrode 11.

The partitions 17, formed of an organic material, are disposed such that they overlap the periphery of the pixel electrode 14. The partitions 17 are formed on the pixel electrode 14 in a pattern having a substantially rectangular opening in plan view, thus forming an aperture serving as the pixel region A.

The organic EL element includes the pixel electrode 14, a hole-injecting/transporting layer 18 formed on the pixel electrode 14, a white light-emitting layer 19 formed on the hole-injecting/transporting layer 18, an electron-injecting/transporting layer 20 formed on the light-emitting layer 19, and the common electrode (second electrode) 21, formed on the electron-injecting/transporting layer 20. The hole-injecting/transporting layer 18, the light-emitting layer 19, and the electron-injecting/transporting layer 20 constitute the organic functional layer 15.

The auxiliary line 22 is formed between the organic functional layer 15 and the common electrode 21 such that it extends through the pixel region A so as to cross longer sides thereof. The auxiliary line 22 is formed of a low-resistance material and is used to prevent occurrence of a potential difference in the common electrode 21. In this embodiment, the auxiliary line 22, which is formed such that it extends through the pixel region A so as to cross the longer sides thereof, does not affect the size of the emission region even if, for example, improper mask alignment causes the auxiliary line 22 to be misaligned. The tolerance of misalignment is the length of the longer sides of the pixel region A. The auxiliary line 22 can therefore leave a wide manufacturing margin, thus contributing to an increased product yield and reduced manufacturing costs. In addition, the width of the partitions 17 can be reduced to increase aperture rate per pixel.

The auxiliary line 22 is formed at a position where it divides the pixel region A into a plurality of subregions. That is, the auxiliary line 22 is disposed so as not to overlap the shorter sides of the pixel region A. If the auxiliary line 22 overlaps the shorter sides, it varies the area of the emission region and causes uneven display brightness.

The common electrode 21 functions as the cathode of the organic EL element. The common electrode 21 is formed of a transparent conductive material such as a magnesium-silver (Mg—Ag) alloy, indium tin oxide (ITO), or indium zinc oxide (IZO). A thin film of such a material, however, has higher resistance than a metal film; in the large-scale organic EL device 1, the film causes a potential difference between the periphery of the common electrode 21, closer to the power-supply side, and the center of the common electrode 21, farther away from the power-supply side. As described above, the potential difference in the common electrode 21 is prevented by providing the auxiliary lines 22.

A protective film 23 is disposed over the entire surface of the common electrode 21. The protective film 23 is disposed over substantially the entire region of the substrate 2 to prevent erosion due to oxygen and moisture in air. The protective film 23 is preferably formed of an inorganic material such as silicon oxynitride in terms of, for example, transparency, adhesiveness, and water resistance. A sealing layer including a buffer layer and a gas barrier layer (second protective film is optionally disposed on the surface of the protective film 23.

The auxiliary line 22, which is disposed on the bottom surface of the common electrode 21 in this embodiment, may be disposed on the top surface of the common electrode 21. In this case, the protective film 23 covers the common electrode 21 and the auxiliary line 22.

A counter substrate 24 is disposed opposite the substrate 2. Color filters 25 corresponding to the three primary colors (R, C, and B) and a black matrix (BM) pattern for blocking light are formed on the counter substrate 24. The counter substrate 24 is disposed such that the color filters 25 face the pixel regions A of the substrate 2. The counter substrate 24 used is a transparent substrate such as a glass substrate.

In this embodiment, alternatively, the pixel regions A can be colored in red (organic functional layers that emit red light), green (organic functional layers that emit green light), and blue (organic functional layers that emit blue light). This method, however, involves higher manufacturing costs than the use of the color filters 25 because of mask production and additional steps resulting from the use of a mask.

Method for Producing Organic EL Device

FIGS. 5A to 5D illustrate steps of a method for producing the organic EL device 1 according to this embodiment. The method for producing the organic EL device 1 will now be described with reference to FIGS. 5A to 5D. In this embodiment, the organic EL device 1 is produced through the steps of forming the individual wiring lines, the drive TFTs 5, and other components on the substrate 2, forming the pixel electrodes 14 on the drive TFTs 5, forming the partitions 17 on the pixel electrodes 14, forming the organic functional layers 15 on the partitions 17, forming the auxiliary lines 22 on the organic functional layers 15, and forming the common electrode 21 over the organic functional layers 15 and the auxiliary lines 22. Of these steps, the step of forming the individual wiring lines, the drive TFTs 5, and other components is the same as known steps; therefore, only the steps thereafter will be described.

(1) Pixel Electrode

Figure 5A:
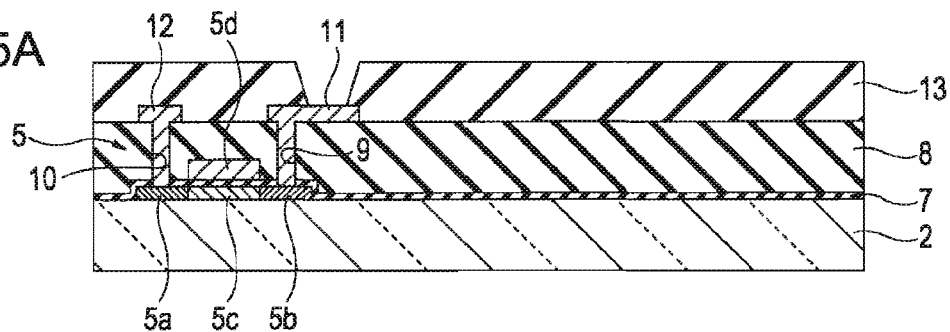
FIGS. 5A to 5D are diagrams illustrating steps of a method for producing the organic EL device.
Figure 5B:
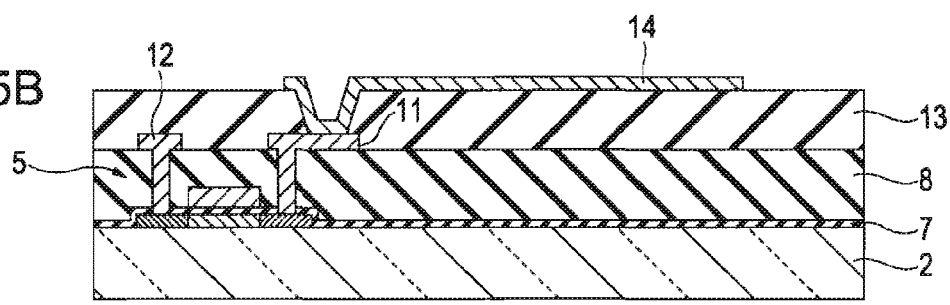

Referring to FIG. 5A, the substrate 2 is prepared, with the drive TFT 5 formed thereon and the second interlayer insulating film 13 formed over the drive TFT 5. The second interlayer insulating film 13 has an opening above the drain electrode 11. Referring to FIG. 5B, the pixel electrode 14 is formed by depositing, for example, aluminum, ITO, or IZO on the entire surface of the second interlayer insulating film 13 by sputtering and then patterning the deposited film by photolithography and etching. Because the organic EL device 1 according to this embodiment has a top-emission structure, as described above, the pixel electrode 14 does not have to be transparent and can be formed of any appropriate conductive material.

(2) Step of Forming Partitions

Figure 5C:
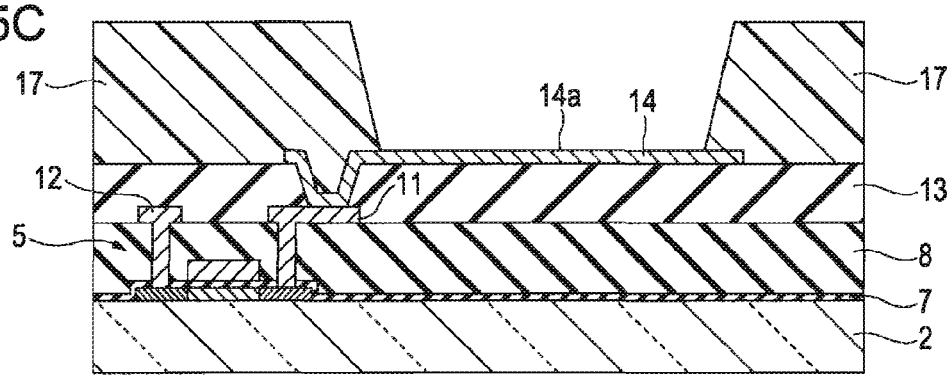

Referring to FIG. 5C, the partitions 17 are formed on the second interlayer insulating film 13 and the pixel electrode 14. The partitions 17 can be formed of a heat-resistant, solvent-resistant organic resin such as an acrylic resin or a polyimide resin. A solution of the organic resin, such as an acrylic resin or a polyimide resin, is applied onto the second interlayer insulating film 13 and the pixel electrode 14 by, for example, spin coating or dip coating. The coating is then dried, heated, and patterned by photolithography to form the partitions 17, thus defining an aperture serving as the pixel region A.

The substrate 2, having the partitions 17 formed thereon, is subjected to plasma treatment to activate an electrode surface 14a of the pixel electrode 14. This plasma treatment is intended mainly to clean the electrode surface 14a of the pixel electrode 14 and to control its work function.

(3) Step of Forming Organic Functional Layer

Figure 5D:
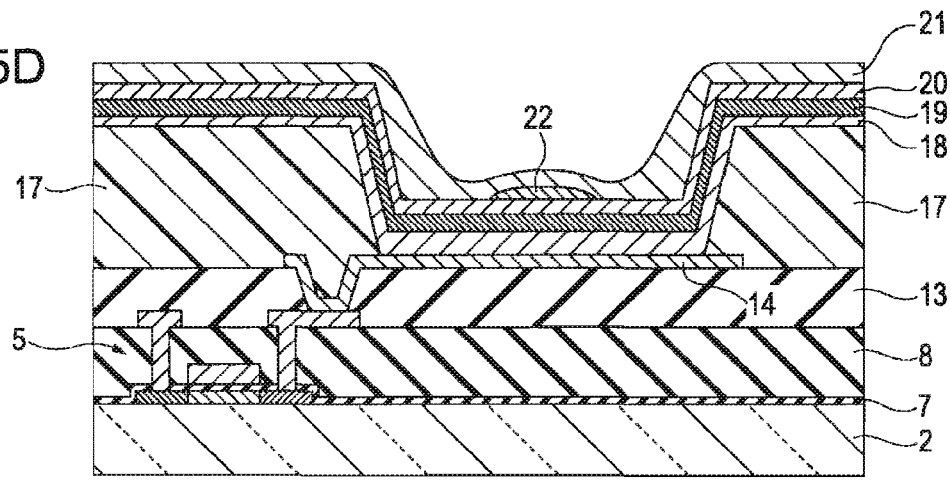

Referring to FIG. 5D, the organic functional layer 15 is formed by forming the hole-injecting/transporting layer 18 on the entire surface of the pixel electrode 14 and the partitions 17, forming the light-emitting layer 19 on the hole-injecting/transporting layer IS, and forming the electron-injecting/transporting layer 20 on the light-emitting layer 19. The hole-injecting/transporting layer 18, the light-emitting layer 19, and the electron-injecting/transporting layer 20 are formed by a known vapor deposition process using deposition materials preferred for the respective layers 19, 20, and 21.

The deposition material used for the light-emitting layer 19 can be a known low-molecular-weight material that can emit white fluorescence or phosphorescence. Examples of the material used include anthracene, pyrene, 8-hydroxyquinoline aluminum, bisstyrylanthracene derivatives, tetraphenylbutadiene derivatives, coumarin derivatives, oxadiazole derivatives, distyrylbenzene derivatives, pyrrolopyridine derivatives, perinone derivatives, cyclopentadiene derivatives, and thiadiazolopyridine derivatives. Such low-molecular-weight materials can also be used in combination with dopants such as rubrene, quinacridone derivatives, phenoxazone derivatives, DCM, DCJ, perinone, perylene derivatives, coumarin derivatives, and diazaindacene derivatives. The deposition material used for the electron-injecting/transporting layer 20 can be, for example, an alkali metal fluoride or oxide, such as LiF, or a magnesium-lithium alloy.

(4) Step of Forming Auxiliary line

Referring to FIG. 5D, the auxiliary line 22 is formed in a straight line so as to the pixel regions A by mask deposition. The auxiliary line 22 is formed of a low-resistance material such as aluminum.

(5) Step of Forming Common Electrode

As shown in FIG. 5D, the common electrode 21 is formed over the entire surfaces of the electron-injecting/transporting layer 20 and the auxiliary line 22. The common electrode 21 is formed by vapor deposition using a transparent conductive material such as a Mg—Ag alloy, ITO, or IZO.

In Steps (3) to (5), the individual layers such as the functional layer 15 are formed by vapor deposition. These steps can be continuously carried out in the same apparatus to shorten the production process and correspondingly reduce the manufacturing costs.

Electronic Apparatus

Figure 6:
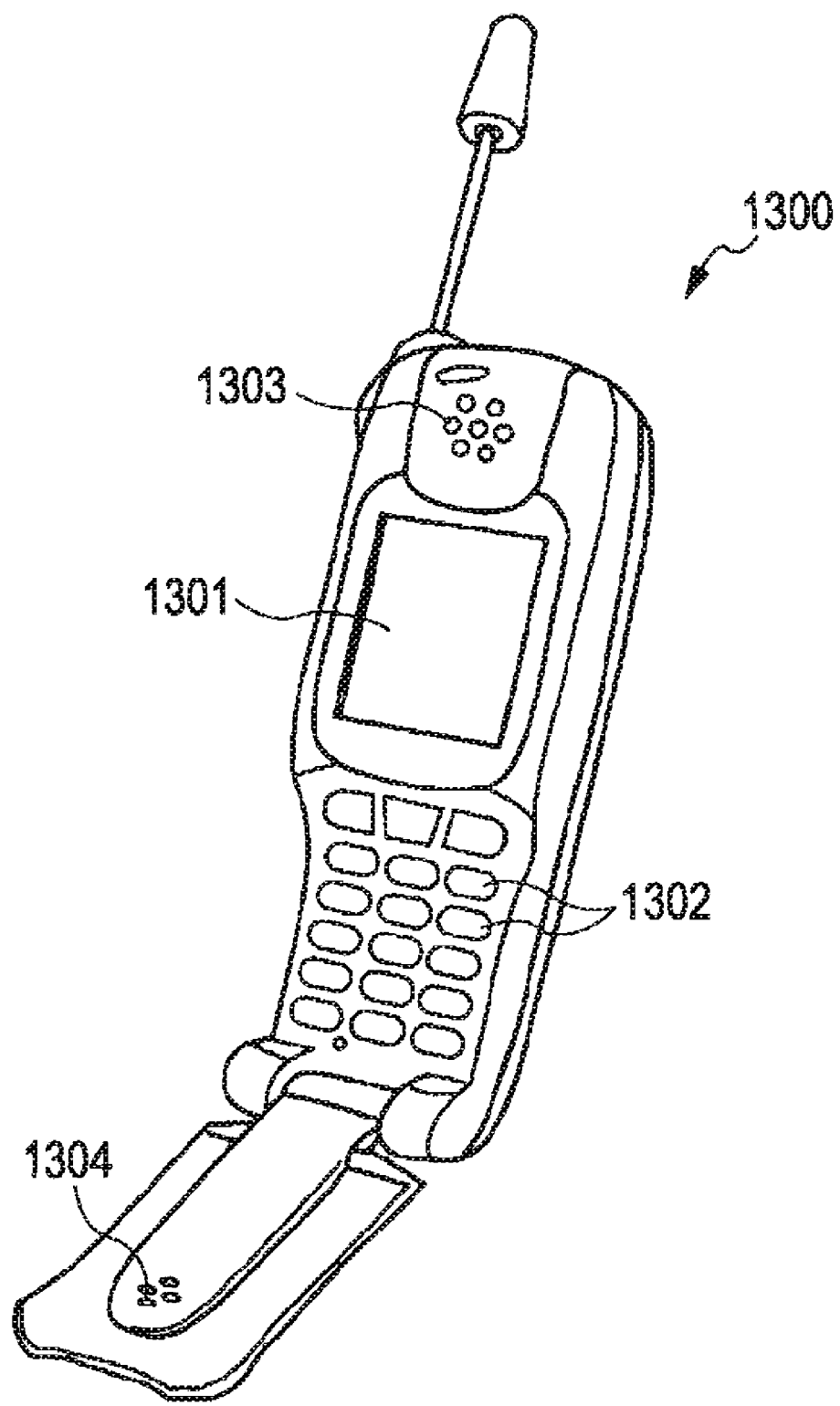
FIG. 6 is a schematic diagram of an example of application of the organic EL device to a display unit of a cellular phone.

Next, an electronic apparatus including an organic EL device according to an embodiment of the invention will be described with reference to FIG. 6. FIG. 6 is a schematic diagram of an example of application of the organic EL device 1 shown in FIG. 1 to a display unit of a cellular phone. In FIG. 6, a cellular phone 1300 includes the organic EL device 1 according to the above embodiment as a small display unit 1301, and also includes operating buttons 1302, an earpiece 1303, and a mouthpiece 1304. Applications of the organic EL device 1 are not limited to cellular phones; the organic EL device 1 is suitable as an image display unit for various apparatuses, including electronic books, projectors, personal computers, digital still cameras, television receivers, camcorders with viewfinders or monitors, car navigation systems, pagers, electronic organizers, calculators, word processors, work stations, video phones, POS terminals, and apparatuses with touch panels. The organic EL device 1 can be used to provide an electronic apparatus with a long life and superior light-emission characteristics.

Example

The effective display region 4 of the organic EL device 1 produced in this example had a resolution of 200 ppi (pixel per inch). As shown in FIG. 3, each pixel measured 127×127 μm, each pixel region A measured (46+46)×22.3 μm, each auxiliary line 22 had a width of 15 μm, and the pitch of the pixel regions A was 20 μm. Using these values, the aperture rate per pixel was calculated to be about 38.2%.

The pixel electrodes 14 were formed by depositing aluminum over the entire surfaces of the drain electrodes 11 and the second interlayer insulating film 13 by sputtering and then patterning the deposited film by photolithography and etching.

The organic functional layers 15 were formed by depositing the hole-injecting/transporting layer 18, the white light-emitting layer 19, and the electron-injecting/transporting layer 20 over the entire surfaces of the pixel electrodes 14 and the partitions 17.

The auxiliary lines 22 were formed by depositing aluminum using a mask. The auxiliary lines 22 had a thickness of 400 nm.

The common electrode 21 was formed by depositing a Mg—Ag alloy over the entire surface of the electron-injecting/transporting layer 20.

In the organic EL device 1 thus produced, the pixel regions A were arranged in lines in the lateral direction thereof, and the auxiliary lines 22 were formed so as to extend in a straight line through the centers of the pixel regions A in the longitudinal direction thereof and the partitions 17 adjacent to the longer sides of the pixel regions A. That is, the auxiliary lines 22 were formed so as to divide the pixel regions A into a plurality of subregions.

Figure 7:
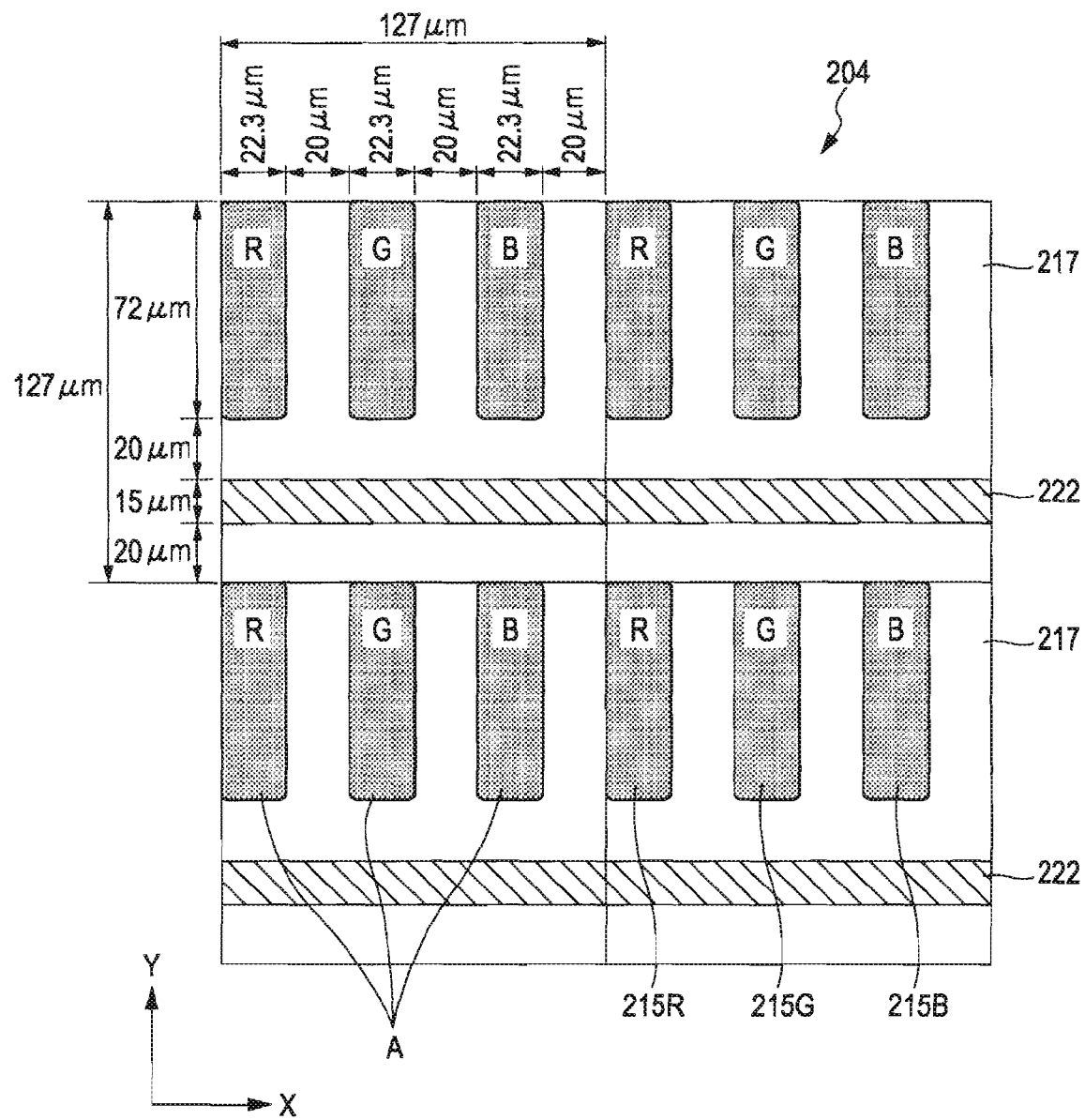
FIG. 7 is an enlarged view of an effective display region of an organic EL device having a known structure.

An organic EL device having a known structure will now be described as a comparative example. FIG. 7 is an enlarged view of the organic EL device of the comparative examples which includes auxiliary lines 222 formed on partitions 217. This organic EL device has an effective display region 204 with a resolution of 200 ppi. Each pixel measures 127×127 μm, each pixel region A measures 72×22.3 μm each auxiliary line 222 has a width of 15 μm, and the pitch of the pixel regions A is 20 μm. In the comparative example, the auxiliary lines 222 and the pixel regions A must be spaced at intervals of 20 μm as a manufacturing margin for the auxiliary lines 222 to prevent the auxiliary lines 222 from overlapping the pixel regions A if they become misaligned. Using these values, the aperture rate per pixel is calculated to be about 29.9%. These results demonstrate that the organic EL device 1 of the example of the invention, having an aperture rate of about 38.2%, achieved an increase in aperture rate of 38.2% minus 29.9%, namely, about 8.3%.

The organic EL device 1 produced in the above example operated successfully in terms of appearance without the influence of the division of the pixel regions A by the auxiliary lines 22.

What is claimed is:

1. An organic electroluminescent (EL) device comprising a substrate;
   first electrodes corresponding to individual pixels on the substrate;
   partitions partitioning the first electrodes to define substantially rectangular pixel regions;
   organic functional layers, corresponding to the individual pixels, disposed at least in the pixel regions;
   a second electrode disposed on the organic functional layers and the partitions; and
   auxiliary lines disposed on a top or bottom surface of the second electrode to support the conductivity of the second electrode, the auxiliary lines extending through the pixel regions so as to cross longer sides thereof and dividing the pixel regions into a plurality of subregions.

2. An electronic apparatus comprising the organic EL device according to claim 1.

3. A method for producing an organic EL device including organic functional layers corresponding to individual pixels on a substrate, the method comprising :
   forming first electrodes corresponding to the individual pixels;
   forming partitions partitioning the first electrodes to define substantially rectangular pixel regions;
   forming the organic functional layers at least in the pixel regions;
   forming a second electrode on the organic functional layers and the partitions; and
   forming auxiliary lines on a top or bottom surface of the second electrode such that the auxiliary lines extend through the pixel regions so as to cross longer sides thereof and divide the pixel regions into a plurality of subregions.

4. The method for producing the organic EL device according to claim 3, wherein the auxiliary lines are formed by mask deposition.

5. The method for producing the organic EL device according to claim 3, wherein the organic functional layers are formed by vapor deposition.

6. The method for producing the organic EL device according to claim 3, wherein the second electrode is formed by vapor deposition.

* * * * *